US006862240B2

(12) United States Patent
Burgan

(10) Patent No.: US 6,862,240 B2
(45) Date of Patent: Mar. 1, 2005

(54) VARIABLE REFRESH CONTROL FOR A MEMORY

(75) Inventor: John M. Burgan, North Palm Beach, FL (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/878,956

(22) Filed: Jun. 28, 2004

(65) Prior Publication Data

US 2004/0233706 A1 Nov. 25, 2004

Related U.S. Application Data

(62) Division of application No. 10/369,985, filed on Feb. 19, 2003, now Pat. No. 6,778,457.

(51) Int. Cl.[7] .................................................. G11C 7/00
(52) U.S. Cl. ...................................... 365/222; 365/201
(58) Field of Search ................................. 365/222, 201, 365/226, 227

(56) References Cited

U.S. PATENT DOCUMENTS

| | | | |
|---|---|---|---|
| 4,716,551 A | 12/1987 | Inagaki ......................... 365/222 |
| 4,736,344 A | 4/1988 | Yanagisawa ................. 365/222 |
| 5,446,695 A | * 8/1995 | Douse et al. ................ 365/222 |
| 5,446,696 A | * 8/1995 | Ware et al. ................... 365/222 |
| 5,593,903 A | 1/1997 | Beckenbaugh et al. ......... 437/8 |
| 5,636,171 A | 6/1997 | Yoo et al. .................... 365/222 |
| 5,654,930 A | 8/1997 | Yoo et al. .................... 365/222 |
| 5,680,359 A | * 10/1997 | Jeong ........................... 708/620 |
| 5,991,214 A | 11/1999 | Merritt et al. ............... 365/201 |
| 6,167,544 A | 12/2000 | Brady .......................... 714/721 |
| 6,229,747 B1 | 5/2001 | Cho et al. .................... 365/222 |
| 6,438,057 B1 | 8/2002 | Ruckerbauer ................ 365/222 |
| 6,483,764 B2 | 11/2002 | Chen Hsu et al. ........... 365/222 |
| 6,603,696 B2 | 8/2003 | Janzen ......................... 365/222 |
| 2002/0136075 A1 | 9/2002 | Chen Hsu .................... 365/222 |

OTHER PUBLICATIONS

Takashima et al, "A Novel Power–Off Mode for a Battery–Backup DRAM," IEEE Journal of Solid–State Circuits, vol. 32, No. 1, Jan. 1997, pp. 86–91.
Yamauchi et al., "A Circuit Technology for a Self–Refresh 16Mb DRAM with Less than 0.5 µA/MB Data–Retention Current," IEEE Journal of Solid–State Circuits, vol. 30, No. 11, Nov. 1995, pp. 1174–1182.
Yamauchi et al., "A Sub–0.5µA/MB Data–Retention DRAM," IEEE International Solid–State Circuits Conference, ISSCC95/Session 14/DRAM/Paper FA 14.1, pp. 244–245 & p. 373.
Choi et al., "Battery Operated 16M DRAM with Post Package Programmable and Variable Self Refresh," IEEE 1994 Symposium on VLSI Circuits Digest of Technical Papers, pp. 83–84.
Konishi et al., "A 38–ns 4–Mb DRAM with a Battery–Backup (BBU) Mode," IEEE Journal of Solid–State Circuits, vol. 25, No. 5, Oct. 1990, pp. 1112–1114.

* cited by examiner

Primary Examiner—Anh Phung
(74) Attorney, Agent, or Firm—Daniel D. Hill

(57) ABSTRACT

A memory (10) includes a variable refresh control circuit (20) for controlling the refresh rate of a memory array (12) using a capacitor for data storage. In one embodiment, each test cell of a plurality of test memory cells (30, 32, 34, and 36) is refreshed at different rates. A monitor circuit (18) is provided for monitoring the stored logic state of each of the plurality of test memory cells, and in response, adjusting the refresh rate of the memory array (12). In another embodiment, a variable refresh control circuit (20') includes a plurality of test memory cells (70, 72, 74, and 76) that are all refreshed at the same rate but each of the test memory cells (70, 72, 74, and 76) is implemented to have a different charge storage capacity than the other test memory cells. The monitor circuit (18) monitors the stored logic state of each of the plurality of test memory cells (70, 72, 74, and 76), and in response, adjusts a refresh rate of the memory array (12).

10 Claims, 3 Drawing Sheets

VARIABLE REFRESH CONTROL FOR A MEMORY

CROSS-REFERENCE TO RELATED, COPENDING APPLICATION

This is a divisional patent application of U.S. patent application Ser. No. 10/369,985, filed Feb. 19, 2003, and having U.S. Pat. No. 6,778,457.

A related, copending application is entitled "MEMORY HAVING VARIABLE REFRESH CONTROL AND METHOD THEREFOR", Perry Pelley et al., application Ser. No. 10/370,011, assigned to the assignee hereof, and filed Feb. 19, 2003.

FIELD OF THE INVENTION

This invention relates generally to integrated circuit memories, and more particularly to a variable refresh control for a dynamic random access memory (DRAM).

BACKGROUND OF THE INVENTION

A dynamic random access memory (DRAM) is a well known memory type that depends on a capacitor to store charge representative of two logic states. Generally, each DRAM cell includes a capacitor and an access transistor. The charge stored on the capacitor leaks away over time, requiring the data stored by DRAM cells to be periodically read and rewritten, or "refreshed". The periodic refresh operation requires a significant amount of power.

The amount of charge leakage from the capacitors varies greatly depending on voltage, temperature and process variations. A higher temperature or voltage causes greater leakage than a relatively lower temperature or voltage. Also, process variations can cause greater leakage. Therefore, for DRAMs having a fixed refresh rate, the memory cells must be refreshed at a rate that will guarantee reliable memory retention at worst case leakage. For battery powered devices, it is important for power consumption to be as low as possible. A fixed refresh rate may require higher power consumption than is necessary for reliable operation of the battery powered memory.

Therefore, there is a need for a DRAM having a variable rate refresh control circuit that accurately determines a refresh rate to reliably control the refresh operations of the memory and reduce power consumption of the memory in battery powered applications.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the following drawings.

DETAILED DESCRIPTION OF THE PREFERRED EMBODIMENT

Generally, the present invention provides a memory having a variable refresh control circuit that includes a plurality of test memory cells to determine an optimum refresh rate for the memory that gives reliable performance and lower power consumption. The variable refresh control circuit includes a plurality of test memory cells. In one embodiment, each of a plurality of substantially identical test memory cells includes a capacitor for storing charge representative of a stored logic state, and each of the plurality of test memory cells is refreshed at a different rate than other test memory cells. A monitor circuit is provided for monitoring the stored logic state of each of the plurality of test memory cells, and in response, a refresh rate of the plurality of memory cells is adjusted.

In another embodiment of the present invention, the variable refresh control circuit includes a plurality of test memory cells, where each of the test memory cells includes a different sized capacitor for storing charge representative of a stored logic state, and each of the plurality of test memory cells is implemented to have a different stored charge and leakage tolerance than the other test memory cells. A monitor circuit monitors the stored logic state of each of the plurality of test memory cells, and in response, adjusts a refresh rate of the plurality of memory cells of memory array 12.

The above embodiments provide the advantage of refreshing a memory array at an optimum refresh rate over a range of process, voltage and temperature (PVT). This allows the memory to be refreshed only as frequently as necessary to provide reliable data storage for any particular PVT. An adjustable lower refresh rate based on feedback from the "on chip" test memory cells will provide lower power consumption of the memory as compared to a memory that uses a fixed higher refresh rate based on worst case PVT.

Figure 1:
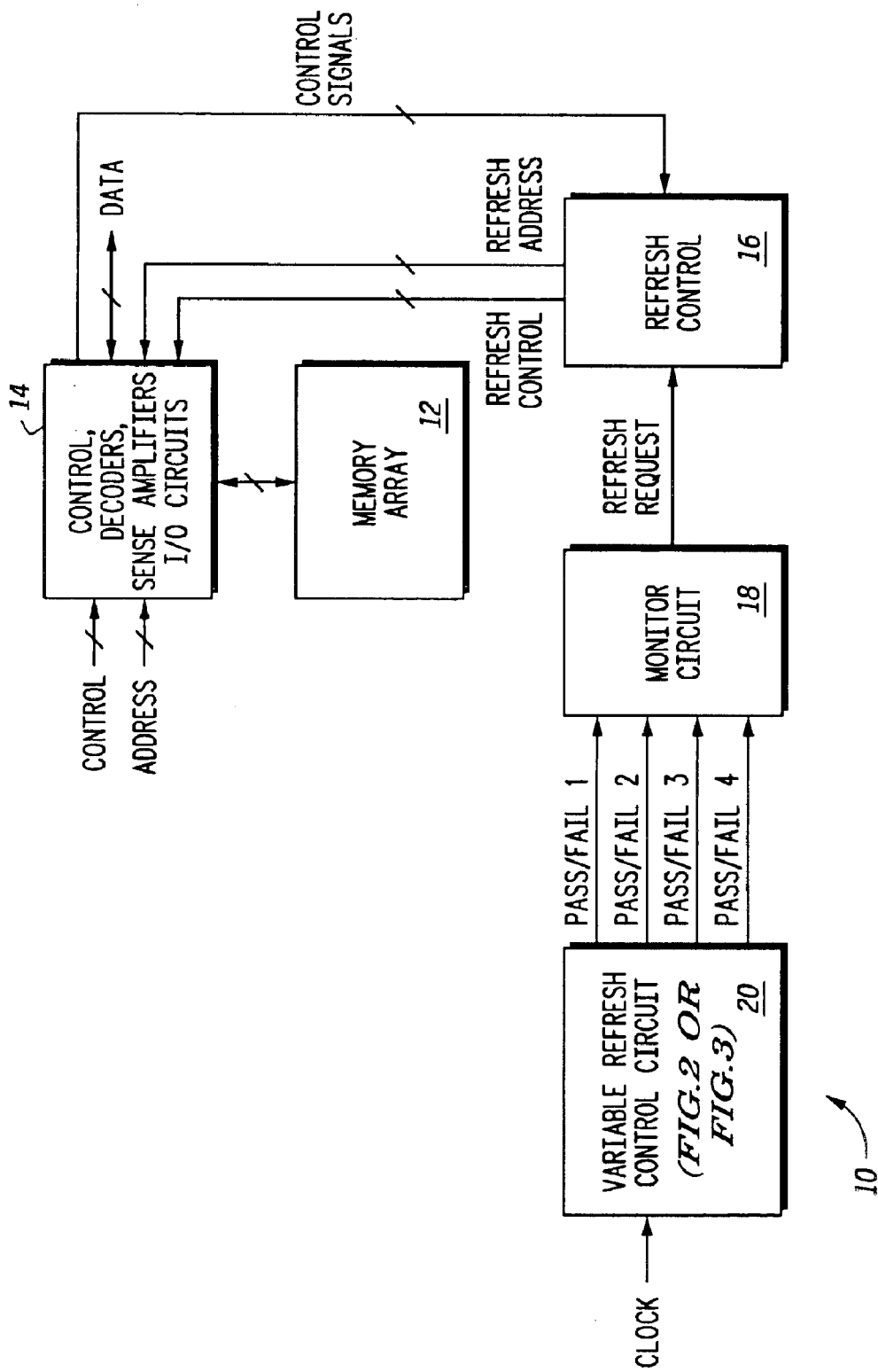
FIG. 1 illustrates, in block diagram form, an integrated circuit memory in accordance with the present invention.

FIG. 1 illustrates, in block diagram form, an integrated circuit memory 10 in accordance with the present invention. Integrated circuit memory 10 includes memory array 12, control, decoders, sense amplifiers, and I/O circuits block 14, refresh control circuit 16, monitor circuit 18, and variable refresh control circuit 20. Integrated circuit memory 10 may be a "stand-alone" memory or an embedded memory. Memory array 12 is an array of memory cells where the memory cells are coupled at the intersections of bit lines and word lines. The memory cells may be organized in multiple blocks of memory cells. In the illustrated embodiment, the memory cells are conventional dynamic random access memory (DRAM) cells having a capacitor and an access transistor. The capacitor is for storing charge representative of a stored logic state. The access transistor is for coupling the capacitor to a bit line in response to a selected word line when accessing the memory cell. In other embodiments, memory array 12 may includes other memory cell types that require periodic refreshing to maintain a stored logic state.

Block 14 includes circuits used for accessing the memory array for read, write, and refresh operations and is coupled to the memory array with a plurality of conductors. Integrated circuit memory 10 functions like a conventional DRAM during read and write operations. Block 14 includes control circuits, row and column decoders, sense amplifiers and I/O circuits. Block 14 receives control signals labeled "CONTROL". The control signals CONTROL include, for example, chip enable, sense enable, write enable, and the like. In response to an address labeled "ADDRESS", the row and column decoders access one or more memory cells of memory array 12. During a read operation, sense amplifiers sense and amplify a voltage on a selected bit line corresponding to a stored logic state and provide a corresponding logic signal to the I/O circuits for further amplification and buffering. The I/O circuits transmit buffered data signals labeled "DATA" to circuits external from memory 10. A write operation to fully recharge the memory cell is accomplished by the precharge circuitry.

Refresh control circuit 16 controls and coordinates refresh operations of memory array 12 in response to CONTROL SIGNALS received from block 14. Refresh operations within memory array 12 and circuit block 14 are conventional and may occur automatically, or in response to an external request for refresh via CONTROL SIGNALS. Refresh control circuit 16 is coupled to circuit block 14 via a plurality of conductors labeled "REFRESH CONTROL" and a plurality of conductors labeled "REFRESH ADDRESS". In addition, refresh control 16 receives a "REFRESH" signal from monitor circuit 18.

Figure 2:
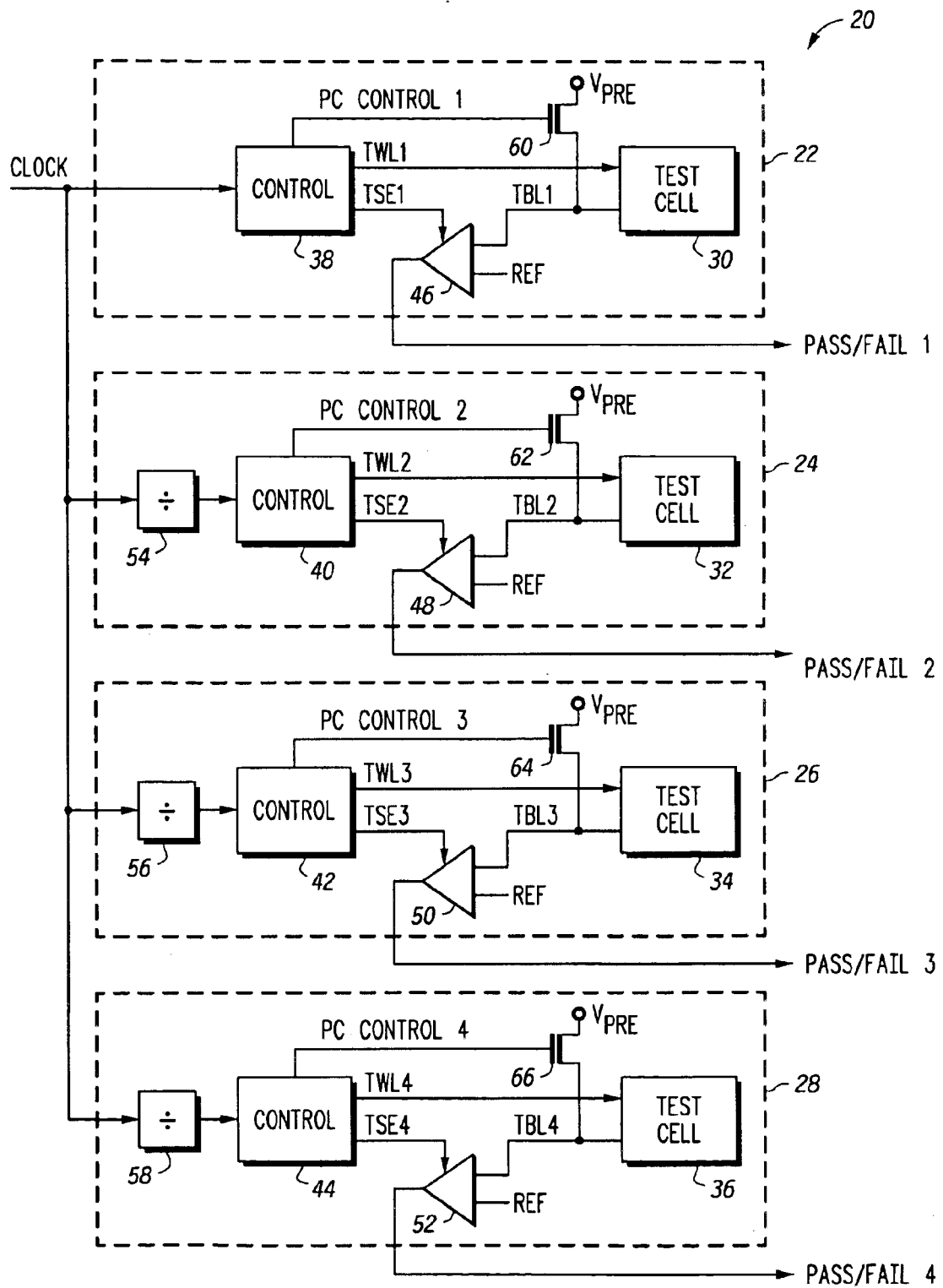
FIG. 2 illustrates, in block diagram form, one embodiment of the variable refresh control circuit of the embodiment of FIG. 1.
Figure 3:
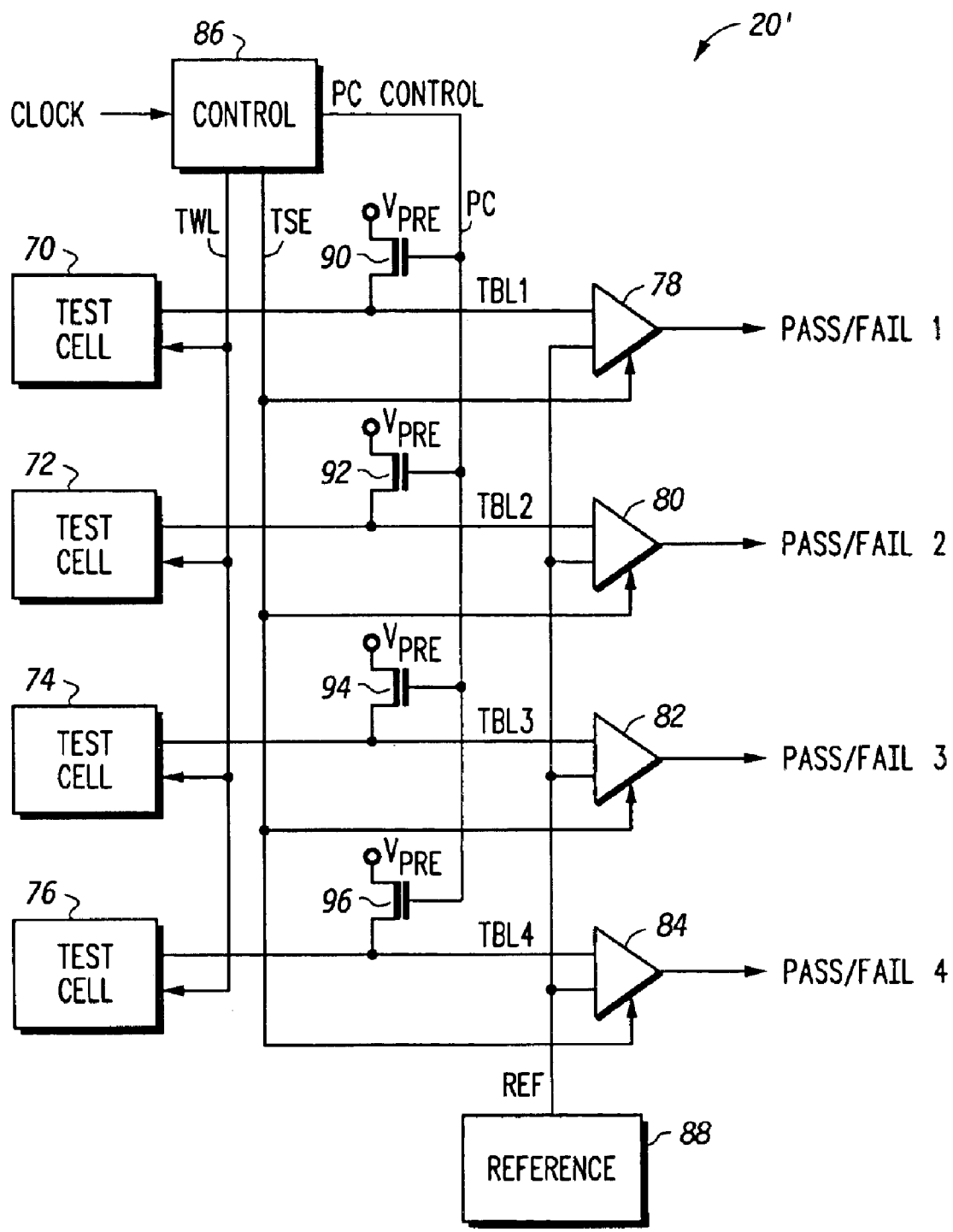
FIG. 3 illustrates, in block diagram form, another embodiment of the variable refresh control circuit of the embodiment of FIG. 1.

Monitor circuit 18 receives a plurality of signals labeled "PASS/FAIL 1" to "PASS/FAIL 4". In response to signals PASS/FAIL 1 to PASS/FAIL 4, monitor circuit 18 provides signal REFRESH REQUEST at the proper timing to leave sufficient margin, to control the rate at which refresh control 16 refreshes memory array 12. The PASS/FAIL signals are provided by variable refresh control circuit 20. Variable refresh control circuit 20 includes a plurality of test memory cells. The test memory cells are implemented using the same manufacturing process as memory array 12 to allow the test memory cells to track PVT variations of the memory cells of memory array 12. The PVT variation affects charge leakage from the cell capacitors. Using the plurality of test memory cells, variable refresh control circuit 20 provides test result signals PASS/FAIL 1–PASS/FAIL 4 resulting from the charge storage measurements of the test cells. FIG. 2 and FIG. 3 illustrate two embodiments for variable refresh control circuit 20, and will be described in more detail below.

FIG.2 illustrates, in block diagram form, variable refresh control circuit 20 of memory 10 of FIG. 1. Variable refresh control circuit 20 includes test cell circuits 22, 24, 26, and 28. Test cell circuit 22 includes test cell 30, control circuit 38, sense amplifier 46, and precharge transistor 60. Test cell circuit 24 includes test cell 32, control 40, sense amplifier 48, divider 54, and precharge transistor 62. Test cell circuit 26 includes test cell 34, control circuit 42, sense amplifier 50, divider 56, and precharge transistor 64. Test cell circuit 28 includes test cell 36, control circuit 44, sense amplifier 52, divider 58, and precharge transistor 66.

Test cells 30, 32, 34, and 36 are manufactured using the same process as the memory cells of memory array 12. This will allow PVT changes to affect charge leakage of the test cells in the same way it affects charge leakage of the memory cells of memory array 12. Each of test cells 30, 32, 34, and 36 is coupled to an input of a corresponding sense amplifier 46, 48, 50, and 52 via a test bit line labeled "TBP1" to "TBL4". Another input of each of sense amplifiers 46, 48, 50, and 52 is for receiving a reference voltage labeled "REF". For a read operation, the reference voltage REF is generally set at a voltage that is about half way between the high and low cell voltages. As shown in FIG. 2, each of the sense amplifiers provide a PASS/FAIL output signal that reflects the state of charge storage of the test cell to which it is coupled. Control circuit 38 provides a test word line voltage labeled "TWL1" to an access transistor of test cell 30. Control circuit 38 also provides a sense enable signal TSE1 to control sense amplifier 46 and provides a control signal labeled "PC CONTROL1" to the gate of precharge transistor 60. Precharge transistor 60 couples a precharge voltage VPRE to test bit line TBL1 for setting the test memory cells to a fully charged condition.

Control circuit 38 receives a clock signal labeled "CLOCK". Clock signal CLOCK is used for timing the operations of test cell circuit 22. Test cell circuits 24, 26, and 28 are similar to test cell circuit 22, except that test cell circuits 24, 26, and 28 include divider circuits for reducing the clock frequency of clock signal CLOCK. Each of the test cell circuits operates at a lower frequency than the test cell circuit immediately above. For example, divider 54 may divide clock signal CLOCK by two, divider 56 may divide clock signal CLOCK by four, and divider circuit 58 may divide clock signal CLOCK by eight. In other embodiments, the clock signal CLOCK may be divided by different amounts. Also, in other embodiments, the frequency of the clock signals to the various test cell circuits may be reduced in a different manner. In addition, in other embodiments, there may be a different number of test cell circuits. For example, there can be any number greater than or equal to two depending on how closely the refresh times are monitored.

In operation, each of the test cells 30, 32, 34, and 36 are refreshed at different rates as determined by the frequency of clock signal CLOCK and the division ratios of dividers 54, 56, and 58. In the illustrated embodiment, the frequency of clock signal clock is much higher than the refresh rate of memory array 12. Sampling more often provides a safety margin to protect the memory cells of memory array 12 from receiving a refresh rate that is too low for reliable operation. Each of word lines TWL1 to TWL4 are asserted high by their respective control circuits. Precharge transistors 60, 62, 64, and 66 provide a precharge voltage to each of bit lines TBL1 to TBL4 to write a logic high state into each of the test cells as timed by control circuits 38, 40, 43, and 44. After precharging, the precharge voltage VPRE is decoupled from the bit lines by deasserting control signal PC CONTROL 1–PC CONTROL 4 making transistors 60, 62, 64, and 66 substantially non-conductive. Note that transistor 60, 62, 64, and 66 are implements using CMOS (complementary metal oxide semiconductor, and can be either P-channel or N-channel conductively types depending on specific design considerations as determined by the application. After precharging, while the word lines are asserted as a logic high, sense amplifiers 46, 48, 50, and 52 are enabled via control circuits 38, 40, 42, and 44 according to their individual timing. The sense amplifiers compare the voltage on the bit lines to the reference voltage REF and output the results of the comparisons to monitor circuit 18. Reference voltage REF is set at a voltage used to test the ability of the test cells to maintain a minimum voltage magnitude. If the bit line voltage of a particular test cell is greater in magnitude than the reference voltage, the sense amplifiers will output a high voltage indicating that the refresh rate of the test cell is acceptable and the test cell is maintaining its data state. However, if the bit line voltage is lower in magnitude than the reference voltage, then too much charge has leaked from the cell for the given refresh rate. The corresponding sense amplifier will output a low voltage indicating that the refresh rate of the test cell is not adequate and the test cell has lost its data.

The series of test cell circuits are continually monitored to insure that memory array 12 is being adequately refreshed. How monitor circuit 18 adjusts the refresh rate depends on how much safety margin is required. For example, if test cell 36, the test cell with the lowest refresh rate, starts to lose its data but test cells 30, 32, and 34 are still maintaining their data, then the current refresh rate of memory array 12 may be maintained. But, if test cell 34 begins to lose its data, then it may be determined that the current refresh rate may not be giving adequate safety margin and monitor circuit 18 will cause the refresh rate of memory array 12 to be increased.

In another embodiment, the test cells may be organized in pairs, where one test cell of the pair stores a charge representative of a logic "one" and the other test cell stores a charge representative of a logic "zero". In this description of the embodiment, it is understood that the charge leaks out of the capacitor over time and would cause the resulting stored value to go from a logic "one" to a logic "zero". However in actual implementation, there may arise a situation that allows charge to leak into a capacitor from a nearby voltage source causing the value to change from a logic "zero" to a logic "one". Using a pair of test cells programmed one each to "zero" and "one" and monitoring for a change of either cell would compensate for this situation. Operation and implementation of the monitoring and control circuits would be the same as the embodiment shown in FIG. 2 except that each test cell of a pair would be refreshed at the same refresh rate.

Also, note that in another embodiment, a discharged cell capacitor of the plurality of memory cells of memory array 12 may represent a logic "one" instead of a logic "zero" and a charged capacitor may represent a logic "zero" instead of a logic "one". In this embodiment, a logic "zero" would be written into each of the plurality of test cells instead of a logic "one".

FIG. 3 illustrates, in block diagram form, variable refresh control circuit 20' in accordance with another embodiment of the present invention. Variable refresh control circuit 20' includes test cells 70, 72, 74, and 76, sense amplifiers 78, 80, 82, and 84, reference circuit 88, control circuit 86 and precharge transistors 90, 92, 94, and 96. Test cell 70 is coupled to one input of sense amplifier 78 via test bit line TBL1, test cell 72 is coupled to one input of sense amplifier 80 via test bit line TBL2, test cell 74 is coupled to one input of sense amplifier 82 via test bit line TBL3, and test cell 76 is coupled to one input of sense amplifier 84 via test bit line TBL4. Test cells 70, 72, 74, and 76 are implemented using the same manufacturing process as the cells of memory array 12. However, each of the test cells is designed to lose charge more quickly over a certain time period relative to the cells of memory array 12. Also, each of the test cells is designed with a different capacitance than the other test cells. For example, test cell 76 stores less charge than test cell 74, test cell 74 less charge than test cell 72, and test cell 72 stores less charge than test cell 70. In addition, unlike the embodiment of FIG. 2, each of test cells 70, 72, 74, and 76 are refreshed at the same rate as determined by clock signal CLOCK.

Control circuit 86 receives clock signal CLOCK and is coupled to the access transistors of each of test cells 70, 72, 74, and 76 via test word line TWL. Control circuit 86 also provides a test enable signal TSE to control terminals of each of sense amplifiers 78, 80, 82, and 84. Precharge transistors 90, 92, 94, and 96 have a current electrode (drain/source terminal) coupled to test bit lines TBL1 to TBL4, respectively. Each of precharge transistors 90, 92, 94, and 96 have a control electrode (gate) coupled to receive control signal PC CONTROL and a current electrode coupled to receive a precharge voltage VPRE. As stated above, each of test cells 78, 80, 82, and 84 are clocked at the same rate, thus only one control circuit is required. Word line TWL is first enabled and the test cells are written with a voltage representing a fully charged state using precharge transistors 90, 92, 94, and 96. Precharge transistors 90, 92, 94, and 96 are decoupled from the test bit lines. After a predetermined time corresponding to the time period between two refresh operations, sense amplifiers 78, 80, 82, and 84 are enabled in response to test sense enable signal TSE. The voltage on each of test bit lines BL1 to BL4 is compared with the reference voltage REF. The reference voltage REF is set at a voltage to test the ability of the test cells to maintain a minimum voltage magnitude. If a bit line voltage is greater than reference voltage REF, then the corresponding test cell is maintaining its stored charge and a logic high PASS/FAIL signal is provided to monitor circuit 18. If a bit line voltage is less than the reference voltage REF, then the corresponding test cell is not maintaining its stored charge and a logic low PASS/FAIL signal is provided to monitor circuit 18.

As discussed above with the embodiment of FIG. 2, the test cells are continually monitored to insure that memory array 12 is being adequately refreshed. How monitor circuit 18 adjusts the refresh rate depends on how much safety margin is required. For example, if the test cell with the lowest charge storage capability, starts to lose its data but the other test cells are still maintaining their data, then the current refresh rate of memory array 12 may be maintained. But if the test cell with the lowest charge storage capability is sensed to have leaked away its charge, then it may be determined that the current refresh rate may not be giving adequate safety margin and monitor circuit 18 will cause the refresh rate of memory array 12 to be increased. Note that embodiment as disclosed in FIG. 3 uses test cells with different sized capacitors to change their charge storage capability relative to each other. However, in other embodiments, the test cells may be designed with the same sized capacitors that leak charge at different rates.

In another embodiment, the test cells of FIG. 3 may be organized in pairs, where one test cell of the pair stores a charge representative of a logic "one" and the other test cell stores a charge representative of a logic "zero". In this description of the embodiment, it is understood that the charge leaks out of the capacitor over time and would cause the resulting stored value to go from a logic "one" to a logic "zero". However in actual implementation, there may arise a situation that allows charge to leak into a capacitor from a nearby voltage source causing the value to change from a logic "zero" to a logic "one". Using a pair of test cells programmed one each to "zero" and "one" and monitoring for a change of either cell would compensate for this situation. Operation and implementation of the monitoring and control circuits would be the same as the embodiment shown in FIG. 3.

Because the embodiment of FIG. 3 requires test cells with different sized charge storage elements, the physical design for the test cells of FIG. 3 must be controlled more carefully than the cells of FIG. 2.

The disclosed embodiments, as illustrated in FIGS. 1–3, allow a memory array to be refreshed at an optimum refresh rate over a temperature range. This allows the memory to be refreshed only as frequently as necessary to provide reliable data storage for a particular temperature. An adjustable lower refresh rate based on temperature will provide lower power consumption of the memory as compared to a memory that uses a fixed higher refresh rate that is based on worst case temperature.

Various changes and modifications to the embodiments herein chosen for purposes of illustration will readily occur to those skilled in the art. For example, variations in the types of conductivities of transistors, the types of transistors, etc. may be readily made. To the extent that such modifications and variations do not depart from the scope of the invention, they are intended to be included within the scope thereof, which is assessed only by a fair interpretation of the following claims.

What is claimed is:

1. A memory comprising:
   a plurality of memory cells that require periodic refreshing to maintain stored data;
   a variable refresh control circuit comprising a plurality of test memory cells, each of the plurality of test memory cells including a capacitor for storing charge representative of a stored logic state, the plurality of test memory cells being refreshed at a predetermined refresh rate, and each of the plurality of test memory cells being implemented to store a different amount of charge than other test memory cells of the plurality of test memory cells; and
   a monitor circuit for monitoring the stored logic state of each of the plurality of test memory cells, and in response, adjusting a refresh rate of the plurality of memory cells.

2. The memory of claim 1 wherein a charge storage ability of one test cell of the plurality of test memory cells is greater than a charge storage ability of each of the plurality of memory cells for the predetermined refresh rate.

3. The memory of claim 1, wherein the plurality of memory cells and the plurality of test memory cells are dynamic random access memory (DRAM) cells.

4. The memory of claim 1, further comprising a sense amplifier coupled to a first test cell of the plurality of test memory cells, the first test cell having a charge storage ability that is greater than a charge storage ability of one of the plurality of memory cells, the sense amplifier providing a signal for indicating if the predetermined refresh rate is sufficient for reliably maintaining a stored logic state of the first test cell.

5. The memory of claim 4, wherein if the predetermined refresh rate is not sufficient for reliably maintaining the stored logic state of the first test cell, increasing the refresh rate of the plurality of memory cells.

6. The memory of claim 1, wherein the plurality of test memory cells are organized as pairs of test memory cells, wherein a pair of test memory cells includes a first test cell and a second test cell, the first test cell for storing a high logic state and the second test cell for storing a low logic state, the each test cell of the pair of test memory cells having a charge leakage rate that is greater than a charge leakage rate of one of the plurality of memory cells.

7. The memory of claim 1, wherein the plurality of test memory cells include a first test cell and a second test cell, the first test cell having a first charge storage ability that is greater than a charge storage ability of one of the plurality of memory cells, the second test cell having a second charge storage ability that is greater than the first charge storage ability.

8. The memory of claim 1, wherein the plurality of test memory cells and the plurality of memory cells are implemented together on a single integrated circuit.

9. A method for refreshing a memory array having a plurality of
   memory cells for storing data, comprising the steps of:
      providing a plurality of test memory cells, each of the plurality of test memory cells being implemented to have different charge storage ability than other test memory cells of the plurality of test memory cells;
      refreshing the test memory cells at a predetermined refresh rate;
      monitoring the charge storage ability of the plurality of test memory cells; and
      adjusting the refresh rate of the memory array in response to the monitoring of the charge storage ability of the plurality of test memory cells.

10. The method of claim 9, where the step of monitoring the charge storage ability of the plurality of test memory cells further comprises monitoring the ability of the plurality of test memory cells to maintain a predetermined minimum voltage maginitude.

* * * * *